(12) United States Patent
Iguchi et al.

(10) Patent No.: US 6,379,782 B2
(45) Date of Patent: Apr. 30, 2002

(54) SEMICONDUCTOR DEVICE FORMED WITH METAL WIRING ON A WAFER BY CHEMICAL MECHANICAL POLISHING, AND METHOD OF MANUFACTURING THE SAME

(75) Inventors: Manabu Iguchi; Yoshihisa Matsubara; Toshiyuki Takewaki, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/840,761

(22) Filed: Apr. 24, 2001

(30) Foreign Application Priority Data

Apr. 27, 2000 (JP) ........................................ 2000-128194

(51) Int. Cl.[7] ............................. H01L 29/40; B32B 3/02
(52) U.S. Cl. ..................... 428/209; 428/210; 428/426; 428/428; 428/432; 428/446; 428/450; 257/622
(58) Field of Search ................................. 428/209, 210, 428/426, 428, 432, 446, 450; 438/430, 589, 758, 692, 778, 703; 257/622

(56) References Cited

U.S. PATENT DOCUMENTS 6,091,130 A  *  7/2000  Oyamtsu et al. ............ 257/619

FOREIGN PATENT DOCUMENTS

JP    402170536 A  *  7/1990
WO   WP 01/56070 A1 *  8/2001

* cited by examiner

Primary Examiner—Deborah Jones
Assistant Examiner—Stephen Stein
(74) Attorney, Agent, or Firm—Rosenman & Colin LLP

(57) ABSTRACT

An insulating layer is formed on a whole surface of a wafer. Recesses such as wiring grooves are formed in the insulating layer. A part of the insulating layer is removed on a region whose distance from the peripheral edge of the wafer is a value x or less. After a conductive film is formed on the whole wafer surface, a part is removed on a region whose distance from the peripheral wafer edge is a value y (y<x) or less. Chemical mechanical polishing removes a part of the conductive except in the recesses. Thereafter, wet etching removes part of the conductive film on a region from the peripheral wafer edge of z (x<z) or less. An interlayer insulating film is formed on the whole wafer surface.

3 Claims, 24 Drawing Sheets

FIG. 3A
PRIOR ART
FIG. 3B
PRIOR ART
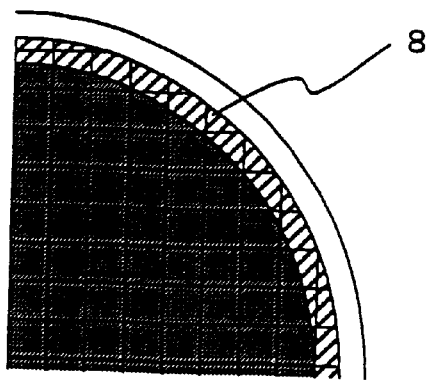
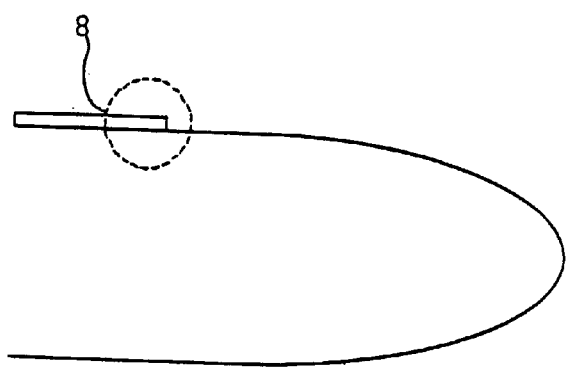
FIG. 3C
PRIOR ART
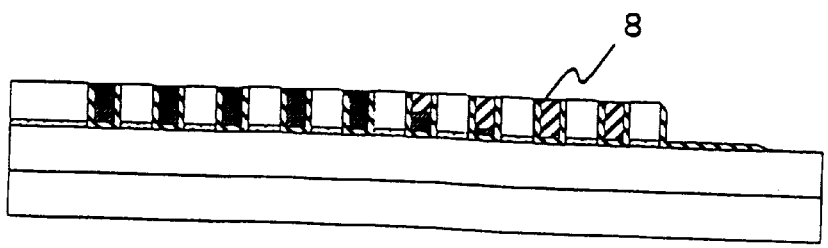

FIG. 5A PRIOR ART
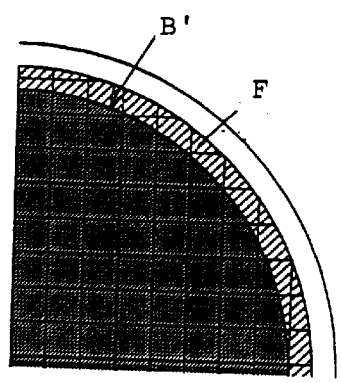
FIG. 5B PRIOR ART
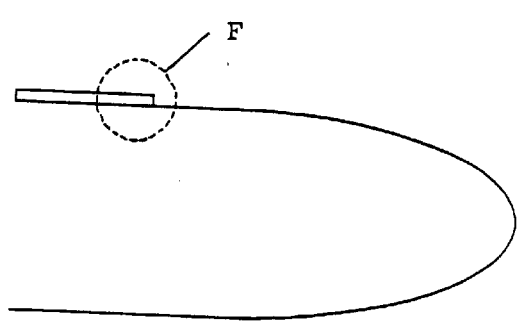
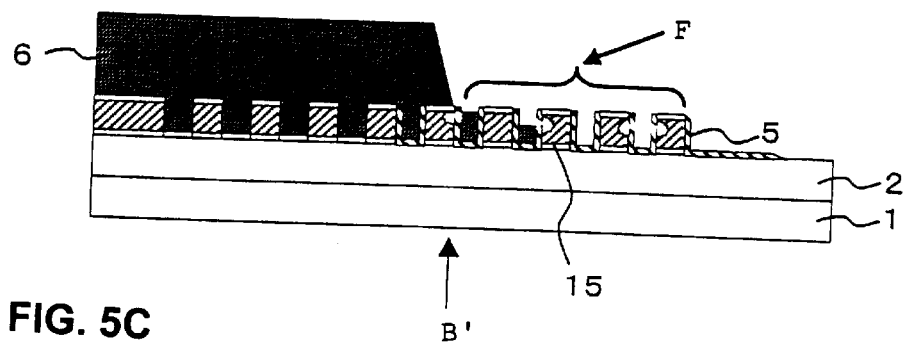
FIG. 5C PRIOR ART

FIG. 18A  FIG. 18B
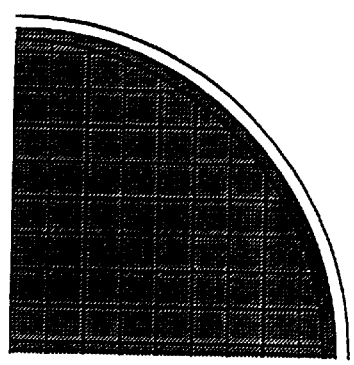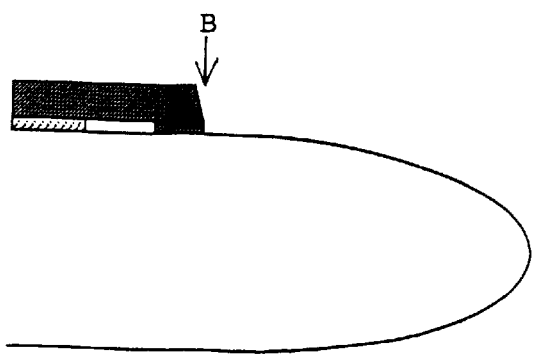
FIG. 18C
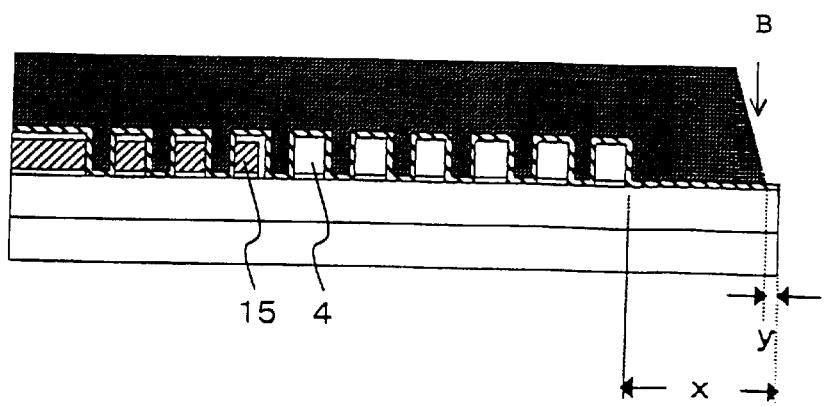

FIG. 19A
FIG. 19B
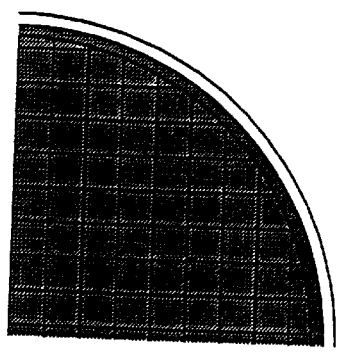
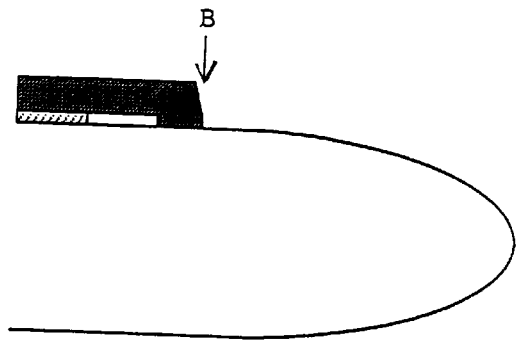
FIG. 19C
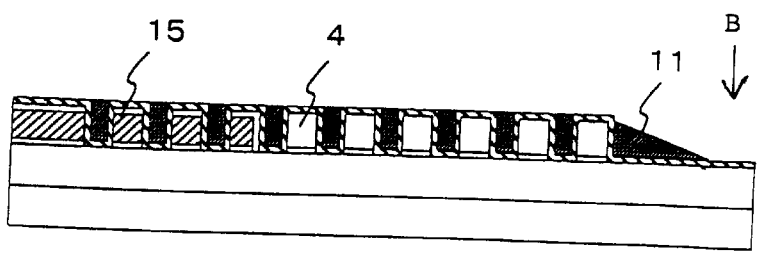

FIG. 20A
FIG. 20B
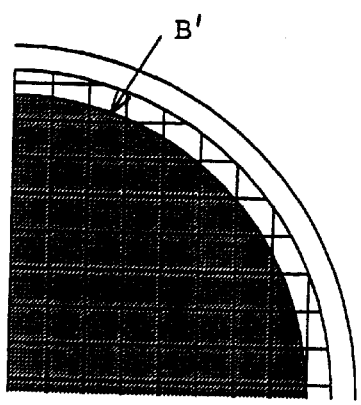
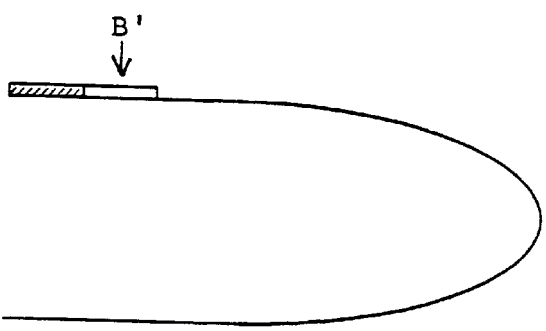
FIG. 20C
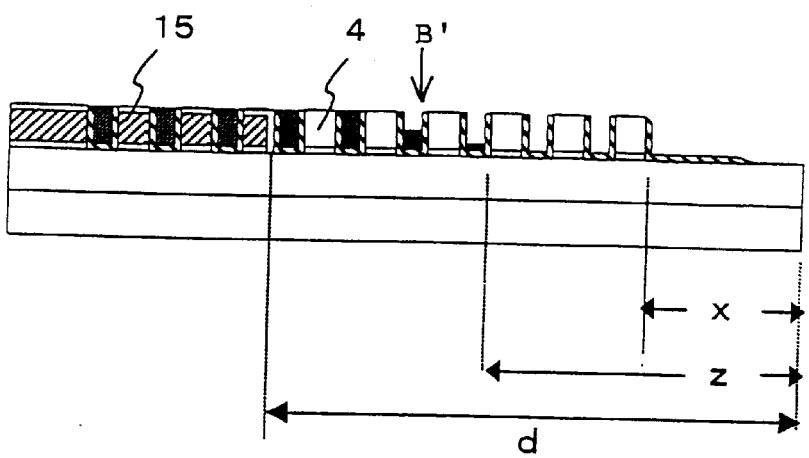

SEMICONDUCTOR DEVICE FORMED WITH METAL WIRING ON A WAFER BY CHEMICAL MECHANICAL POLISHING, AND METHOD OF MANUFACTURING THE SAME

BACKGROUND OF THE INVENTION

1. Field of the Invention

The present invention relates to techniques by which metal wiring, plugs, pads, etc. are formed on a semiconductor wafer through chemical mechanical polishing (hereinbelow, suitably termed "CMP").

2. Description of the Related Art

In recent years, various microfabrication technologies have been researched and developed with the higher integration densities and finer structures of semiconductor devices. Among them, CMP technology is indispensable in cases of forming embedded metal wiring, interlayer connection plugs, etc.

Now, a prior-art process for forming damascened copper wiring by CMP will be explained with reference to the drawings.

Initially, as shown in FIGS. 1A–1C, a copper film 6 is formed on a silicon oxide film 4 formed with a wiring groove pattern.

More specifically, first of all, a silicon oxide film 2, a silicon oxynitride film 3 and the silicon oxide film 4 are formed on a silicon wafer 1 in the mentioned order. Secondly, wiring grooves in the predetermined pattern are formed by known lithographic and etching techniques. On this occasion, the silicon oxide film 4 on the peripheral part of the wafer is removed by performing a peripheral exposure with the remaining part of the wafer being masked. The peripheral exposure is a process for removing a resist which remains in the vicinity of the peripheral part of the wafer. Point A is an inner end position of the peripheral exposure. Owing to the peripheral exposure, it is possible to prevent a semiconductor manufacturing apparatus from being contaminated by the remaining resist, the peeled part of the silicon oxide film 4 on the peripheral part of the wafer, and so forth.

Subsequently, a barrier metal film 5 is formed on the whole surface of the wafer by sputtering, whereafter the copper film 6 is formed. The copper film 6 is formed by plating, CVD (Chemical Vapor Deposition), or the like. When the formation of the copper film 6 has ended, copper adheres to the back surface and peripheral part of the silicon wafer 1 as shown in FIG. 1B and 1C. Accordingly, the copper adhering to these parts is removed by wet processing (refer to FIGS. 2A–2C). More specifically, the adhesion between the barrier metal film 5 and the copper film 6 is not sufficient so that, when an interlayer insulating film is formed without removing the adhering copper, the copper film 6 peels off to incur the contamination of the wafer and the apparatus (termed "cross-contamination" below) through the conveyance system. Moreover, the copper having once peeled off adheres to the silicon wafer 1 again to cause an inferior film formation or adversely affect a device performance by diffusing into the silicon wafer 1.

In order to avoid such problems, the copper on a peripheral exposure region needs to be completely removed as shown in FIG. 2C. Therefore, a region where the copper film 6 is etched and removed is set so as to extend from a position inside the peripheral exposure region (nearer to the central part of the wafer) to the peripheral edge of the silicon wafer 1, that is, from a position at which the patterned silicon oxide film 4 exists, to the peripheral edge of the silicon wafer 1 (refer to FIGS. 2A–2C). In this way, the copper on the peripheral exposure region can be reliably removed. Point B is an inner end position of wet etching for removal of copper at a peripheral region and back surface of the wafer. C is a region of exposed wiring grooves. D is a region of peripheral exposure.

Subsequently, the superfluous parts of the copper film 6 and barrier metal film 5 are polished away by the CMP, thereby to form the damascened copper wiring in which the copper film 6 is embedded in the wiring grooves (refer to FIGS. 3A–3C). The CMP is implemented in such a way that the surface of the copper film 6 is polished with a polishing slurry by a polishing pad. The polishing slurry usually contains polishing grains and an oxidizer as main components. When the copper film 6 is polished by the CMP, polishing debris 8 (chiefly, polishing grains) having appeared due to the CMP inevitably adhere into the wiring grooves vicinal to the peripheral edge of the silicon wafer 1. As shown in FIG. 3C, therefore, the wiring grooves are filled with the polishing debris 8 in the vicinity of the peripheral edge of the wafer 1.

Thereafter, a protective film 9 and the interlayer insulating film 10 which are made of SiN are formed on the whole surface of the wafer, whereby the damascened copper wiring is finished up (refer to FIGS. 4A–4C).

However, the copper wiring formed as explained above is in the state in which the polishing debris 8 are packed into the wiring grooves vicinal to the peripheral edge of the wafer as shown in FIGS. 4A–4C, and it is liable to pose various problems, for example, that the interlayer insulating film 10 peels off on the polishing debris 8. For the purpose of avoiding such problems, it is also considered to remove the polishing debris 8 at the stage of FIGS. 3A–3C. It is difficult, however, to sufficiently remove the polishing debris 8 adhering in the grooves. At a region E, an innerlayer film might peel off. Point B'0 is an inner end position of wet etching for removal of copper residue like a sidewall.

Meanwhile, in recent years, a low permittivity film of HSQ (Hydrogen Silisesquioxane) or the like is often employed instead of the silicon oxide film 4 as the material of an insulating film for wiring layers in order to prevent the crosstalk between adjacent wiring lines, etc. In general, however, the low permittivity film is less resistant against chemicals and is susceptible to damages during a manufacturing process. Therefore, when the HSQ film is substituted for the silicon oxide film 4 in the process of FIG. 1A–FIG. 4C, it is damaged by an etchant at the stage of FIGS. 2A–2C. This state is shown in FIGS. 5A–5C. As seen from these figures, the wiring grooves are exposed in the vicinity of the peripheral edge of the wafer. Inside of each wiring groove is covered with the barrier metal film 5. Nevertheless, the barrier metal film 5 is not entirely uniform in thickness to cover the wiring groove completely, but it includes a local thinner part and even fails to cover the wiring line. Therefore, the etchant permeates through such parts at the wet etching step of the copper, resulting in the damages of the low permittivity film 15. Thus, voids appear in the HSQ film 15 to incur such various problems that the interlayer insulating film 10 above the voids peels off and that the permittivity characteristics of the low permittivity film 15 degrade. At a region F, a low permittivity film is damaged.

SUMMARY OF THE INVENTION

In view of the above circumstances, an object of the present invention is to prevent wiring grooves from being filled with polishing debris of CMP and to prevent a wiring-layer insulating film from suffering damage in the vicinity of the peripheral edge of a wafer, thereby to prevent the interlayer insulating film from peeling off and to improve the product yield and the reliability of a semiconductor device.

With a method of manufacturing a semiconductor device according to the present invention, at least one insulating layer is first formed on the whole surface of a wafer. Secondly, a plurality of recesses is formed in the insulating layer. Further, a part of the insulating layer is removed on a region whose distance from the peripheral edge of the wafer is a predetermined value x or less (FIG. 7I). Subsequently, a conductive film is formed on the whole surface of the wafer. Besides, a part of the conductive film is removed on a region whose distance from the peripheral edge of the wafer is a predetermined value y (y<x) or less (FIG. 8C). Further, the part of the conductive film on a region except the recesses is removed by chemical mechanical polishing. Also, a part of the conductive film is removed on a region whose distance from the peripheral edge of the wafer is a predetermined value z (x<z) or less (FIG. 13C). Thereafter, an interlayer insulating film is formed on the whole surface of the wafer.

According to this method, the part of the conductive film on the region whose distance from the peripheral edge of the wafer is the value z or less is removed after the chemical mechanical polishing has been carried out. Therefore polishing debris are not packed into the recesses, and the interlayer insulating film can be effectively prevented from peeling off.

With another method according to the present invention, a silicon oxide film is first formed on the peripheral region of the surface of a wafer whose distance from the peripheral edge of the wafer is a predetermined value d or less. Secondly, a low permittivity film having a lower permittivity than that of the silicon oxide film is formed on the region of the wafer surface which is other than the peripheral region thereof. Further, a plurality of recesses is formed in the silicon oxide film and the low permittivity film. Subsequently, a part of the silicon oxide film is removed on a region whose distance from the peripheral edge of the wafer is a predetermined value x (x<d) or less (FIG. 15G). Still further, a conductive film is formed on the whole surface of the wafer. Also, a part of the conductive film is removed on a region whose distance from the peripheral edge of the wafer is a predetermined value z (x<z<d) or less. Thereafter, an interlayer insulating film is formed on the conductive film.

According to this method, the silicon oxide film is formed on the peripheral region, while the low permittivity film is formed on the region other than the peripheral region. In an element forming region, accordingly, the low permittivity film is arranged between the adjacent parts of the conductive film, and crosstalk is effectively prevented. On the other hand, in the peripheral region outside the element forming region, the silicon oxide film having high resistance against chemicals is arranged, and hence, the interlayer insulating film is effectively prevented from peeling off due to the damages of the wiring-layer insulating film.

With still another method according to the present invention, a silicon oxide film is first formed on that peripheral region of the surface of a wafer whose distance from the peripheral edge of the wafer is a predetermined value d or less. Secondly, a low permittivity film having a lower permittivity than that of the silicon oxide film is formed on the region of the wafer surface which is other than the peripheral region thereof. Further, a plurality of recesses is formed in the silicon oxide film and the low permittivity film. Subsequently, a part of the silicon oxide film is removed on a region whose distance from the peripheral edge of the wafer is a predetermined value x (x<d) or less. Still further, a conductive film is formed on the whole surface of the wafer. In addition, a part of the conductive film is removed on a region whose distance from the peripheral edge of the wafer is a predetermined value y (y<x) or less. Besides, the part of the conductive film on the region other than the recesses is removed by chemical mechanical polishing. Also, a part of the conductive film is removed on a region whose distance from the peripheral edge of the wafer is a predetermined value z (x<z<d) or less. Thereafter, an interlayer insulating film is formed on the whole surface of the wafer.

According to this method, the silicon oxide film is formed on the peripheral region, while the low permittivity film is formed on the region other than the peripheral region. Moreover, the part of the conductive film is removed on the region whose distance from the peripheral edge of the wafer is the predetermined value z or less after the chemical mechanical polishing has been carried out. Accordingly, the interlayer insulating film can be effectively prevented from peeling off due to the damage of the wiring-layer insulating film or the adherence of polishing debris.

Meanwhile, according to the present invention, there is provided a semiconductor device in which at least one insulating layer is formed on the principal surface of a wafer, a plurality of recesses are provided in the insulating layer, an insulating film formed in touch with the insulating layer is embedded in the recesses in the vicinity of the peripheral edge of the wafer, and a conductive film is embedded in the recesses on the region other than the vicinity of the peripheral edge of the wafer.

In this semiconductor device, the recesses on the region other than the vicinity of the peripheral edge of the wafer are filled with the conductive film, thereby to construct wiring lines or the likes. Therefore, the crosstalk between the wiring lines or the likes can be relieved to enhance the reliability and high-speed operability of the device. On the other hand, the recesses in the vicinity of the peripheral edge of the wafer are filled with the insulating film formed in touch with the insulating layer. Therefore, the peeling of a film such as an interlayer insulating film is less liable to occur in the vicinity of the peripheral edge of the wafer, and the appearance of the residue of the conductive film is suppressed at the peripheral end part of the wafer. Thus, the quality stability of the element can be enhanced.

Besides, according to the present invention, there is provided a semiconductor device in which an insulating layer is formed on the principal surface of a wafer, a conductive film is embedded in a plurality of recesses provided in the insulating layer, an insulating film is formed on the conductive film, and the insulating layer consists of a silicon oxide film provided on a region in the vicinity of the peripheral edge of the wafer, and a low permittivity film having a lower permittivity than that of the silicon oxide film is provided on the region other than the vicinity of the peripheral edge of the wafer.

According to this semiconductor device, the insulating layer is constructed of the silicon oxide film provided on the region in the vicinity of the peripheral edge of the wafer, and the low permittivity film having a lower permittivity than that of the silicon oxide film and provided on the region other than the vicinity of the peripheral edge of the wafer. In the element forming region, accordingly, crosstalk is effectively preventable because the low permittivity film is arranged between the adjacent parts of conductive film. On the other hand, in the vicinity of the peripheral edge of the wafer (on the region outside the element forming region), the peeling of an interlayer insulating film attributed to the damages of the insulating film is effectively preventable because silicon oxide film having high resistance against chemicals is arranged.

The above and other objects, features and advantages of the present invention will become apparent from the following description with reference to the accompanying drawings which illustrate examples of the present invention.

BRIEF DESCRIPTION OF THE DRAWINGS

FIG. 3A is an enlarged plan view of a wafer for explaining the prior-art method of manufacturing a semiconductor device;

FIG. 3B is an enlarged sectional view of the bevel part of the wafer for explaining the prior-art method of manufacturing a semiconductor device;

FIG. 3C is an enlarged sectional view of the wiring pattern at the outer peripheral part of the wafer for explaining the prior-art method of manufacturing a semiconductor device;

FIG. 5A is an enlarged plan view of a wafer for explaining the prior-art method of manufacturing a semiconductor device;

FIG. 5B is an enlarged sectional view of the bevel part of the wafer for explaining the prior-art method of manufacturing a semiconductor device;

FIG. 5C is an enlarged sectional view of a wiring pattern at the outer peripheral part of the wafer for explaining the prior-art method of manufacturing a semiconductor device;

FIG. 18A is an enlarged plan view of the wafer for explaining another method of manufacturing a semiconductor device according to the present invention;

FIG. 18B is an enlarged sectional view of the bevel part of the wafer for explaining another method of manufacturing a semiconductor device according to the present invention;

FIG. 18C is an enlarged sectional view of the wiring pattern at the outer peripheral part of the wafer for explaining another method of manufacturing a semiconductor device according to the present invention;

FIG. 19A is an enlarged plan view of the wafer for explaining another method of manufacturing a semiconductor device according to the present invention;

FIG. 19B is an enlarged sectional view of the bevel part of the wafer for explaining another method of manufacturing a semiconductor device according to the present invention;

FIG. 19C is an enlarged sectional view of the wiring pattern at the outer peripheral part of the wafer for explaining another method of manufacturing a semiconductor device according to the present invention;

FIG. 20A is an enlarged plan view of the wafer for explaining another method of manufacturing a semiconductor device according to the present invention;

FIG. 20B is an enlarged sectional view of the bevel part of the wafer for explaining another method of manufacturing a semiconductor device according to the present invention;

FIG. 20C is an enlarged sectional view of the wiring pattern at the outer peripheral part of the wafer for explaining another method of manufacturing a semiconductor device according to the present invention;

DESCRIPTION OF THE PREFERRED EMBODIMENTS

Figure 1A:
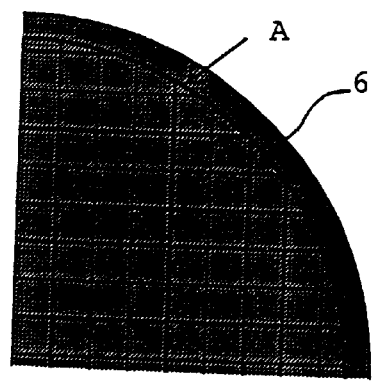
FIG. 1A is an enlarged plan view of a wafer for explaining a prior-art method of manufacturing a semiconductor device.
Figure 1B:
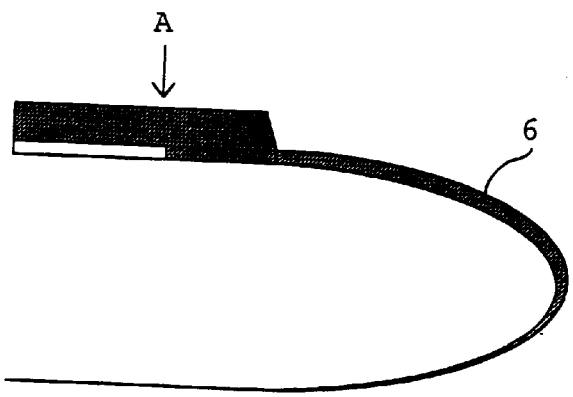
FIG. 1B is an enlarged sectional view of the bevel part of the wafer for explaining the prior-art method of manufacturing a semiconductor device.
Figure 1C:
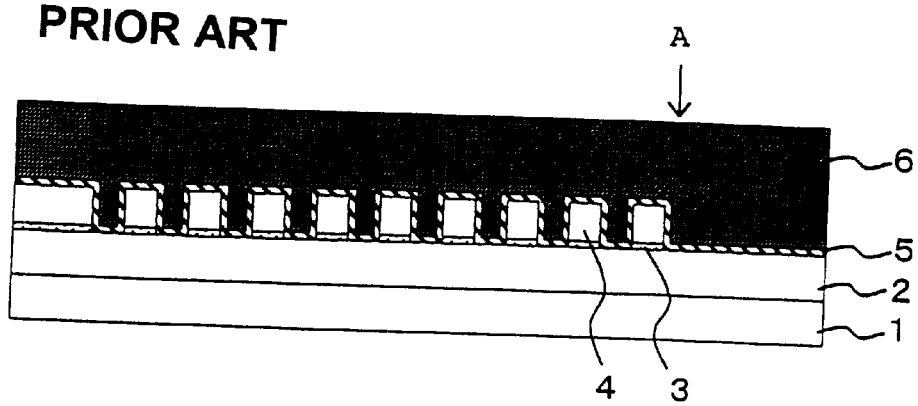
FIG. 1C is an enlarged sectional view of a wiring pattern at the outer peripheral part of the wafer for explaining the prior-art method of manufacturing a semiconductor device.

There will be described an embodiment of a method of manufacturing a semiconductor device according to the present invention. First, an insulating layer made of at least one insulating material is formed on the whole surface of a wafer. Here, the expression "insulating layer made of at least one insulating material" means an insulating layer in which one or more sorts of insulating films are included within the identical layer.

Subsequently, a plurality of recesses is formed in the insulating layer by dry etching or the like. The recesses can be brought into any desired shape such as grooves, trenches or holes. On the other hand, the part of the insulating layer on a region whose distance from the peripheral edge of the wafer is a predetermined value x or less is removed by dry etching or the like. This can be implemented by a process which includes so-called peripheral exposure. The formation of the recesses and the removal of the insulating layer at the peripheral part of the wafer may be done either simultaneously or separately.

Subsequently, a conductive film is formed on the whole surface of the wafer, whereafter the part of the conductive film on a region whose distance from the peripheral edge of the wafer is a predetermined value y (y<x) or less is removed. The removal is done by wet etching which employs an etchant containing hydrofluoric acid or an etchant containing nitric acid, for example.

Thereafter, chemical mechanical polishing is carried out to remove the part of the conductive film on a region except the recesses. Thus, a structure in which the recesses are filled with the conductive film is formed. Incidentally, embedded wiring lines, interlayer connection plugs, etc. are mentioned as concrete embodiments of such a structure.

At the next step, the part of the conductive film on a region whose distance from the peripheral edge of the wafer is a predetermined value z (x<z) or less is removed, followed by forming an interlayer insulating film on the wafer. The removal of the conductive film at this step is done by wet etching which employs an etchant containing hydrofluoric acid or an etchant containing nitric acid, for example. Owing to the removal, the part of the conductive film vicinal to the peripheral edge of the wafer is removed, and cross-contamination can be effectively prevented. Moreover, since the removal is done after the chemical mechanical polishing, recesses can be prevented from being filled with polishing debris the recesses, and the interlayer insulating film can be effectively prevented from peeling off.

In the above manufacturing method, the insulating layer preferably consists of a silicon oxide film which is formed on a region vicinal to the peripheral edge of the wafer, and a low permittivity film which has a lower permittivity than that of the silicon oxide film and which is formed on a region except the vicinity of the peripheral edge of the wafer. Thus, the insulating layer can be effectively prevented from suffering damage at the removal of the conductive film. Moreover, crosstalk can be effectively reduced owing to the use of the low permittivity film.

There will be described another embodiment of a method of manufacturing a semiconductor device according to the present invention. A silicon oxide film is formed on that peripheral region of the surface of a wafer whose distance from the peripheral edge of the wafer is a predetermined value d or less, while a low permittivity film having a lower permittivity than that of the silicon oxide film is formed on the region of the wafer surface which is other than the peripheral region thereof.

Subsequently, a plurality of recesses is formed in the insulating layer (consisting of the silicon oxide film and the low permittivity film) by dry etching or the like. The recesses can be brought into any desired shape such as grooves, trenches or holes. On the other hand, the part of the insulating layer on a region whose distance from the peripheral edge of the wafer is a predetermined value x or less is removed by dry etching or the like. This can be implemented by a process which includes so-called peripheral exposure. The formation of the recesses and the removal of the insulating layer at the peripheral part of the wafer may be done either simultaneously or separately.

Subsequently, a conductive film is formed on the whole surface of the wafer, whereafter the part of the conductive film on a region whose distance from the peripheral edge of the wafer is a predetermined value z (x<z) or less is removed. CMP may be carried out after the formation of the conductive film. Considered in this case are a process (1) in which the formation of the conductive film, the removal of the peripheral part of the conductive film, and the CMP are implemented in the mentioned order, and a process (2) in which the formation of the conductive film, the CMP, and the removal of the peripheral part of the conductive film are implemented in the mentioned order. The process (2) is more favorable because the recesses can be prevented from being filled with polishing debris ascribable to the CMP.

Thereafter, an interlayer insulating film is formed on the conductive film, whereby the semiconductor device including the embedded conductive film is fabricated. According to this manufacturing method, the part of the wiring-layer insulating film vicinal to the peripheral edge of the wafer can be prevented from suffering damage, and the interlayer insulating film can be effectively prevented from peeling off.

In the above method of manufacturing the semiconductor device, the step of forming the silicon oxide film on the peripheral region vicinal to the peripheral edge and the low permittivity film on the region other than the peripheral region can be performed by the following steps (a)–(c):

(a) the step of forming the film of the low permittivity material, on the region of the wafer surface which is other than the peripheral region thereof (b) the step of forming the silicon oxide film on the whole surface of the wafer (c) the step of flattening the whole surface Alternatively, the step can be performed by the following steps (a)–(c):

(a) the step of forming a first silicon oxide film, a second silicon oxide film, and a hydrophobic film higher in hydrophobicity than silicon oxide, on the wafer in the mentioned order (b) the step of etching the second silicon oxide film on the region other than the peripheral region to expose the first silicon oxide film therein (c) the step of spin-coating the whole surface of the wafer with the low permittivity material having a lower permittivity than that of the silicon oxide film, thereby to form the low permittivity film selectively on the exposed surface of the first silicon oxide film A silicon nitride film, a silicon oxynitride film or the like can be employed as the hydrophobic film at the step (a).

According to these methods, the silicon oxide film and the low permittivity film can be comparatively easily formed as designed.

In the method of manufacturing the semiconductor device according to the present invention, the low permittivity film is made of the material having a lower permittivity than that of silicon oxide (k=3.9 through 4.2). Concretely mentioned as such low permittivity films are an inorganic SOG (Spin On Glass) film, an organic SOG film, a fluorine containing film, a Xerogel film, etc. Among them, an HSQ film (k=2.8 through 3.2) being a kind of inorganic SOG film, and the organic SOG film are appropriately used because stable performances are attained.

Figure 6:
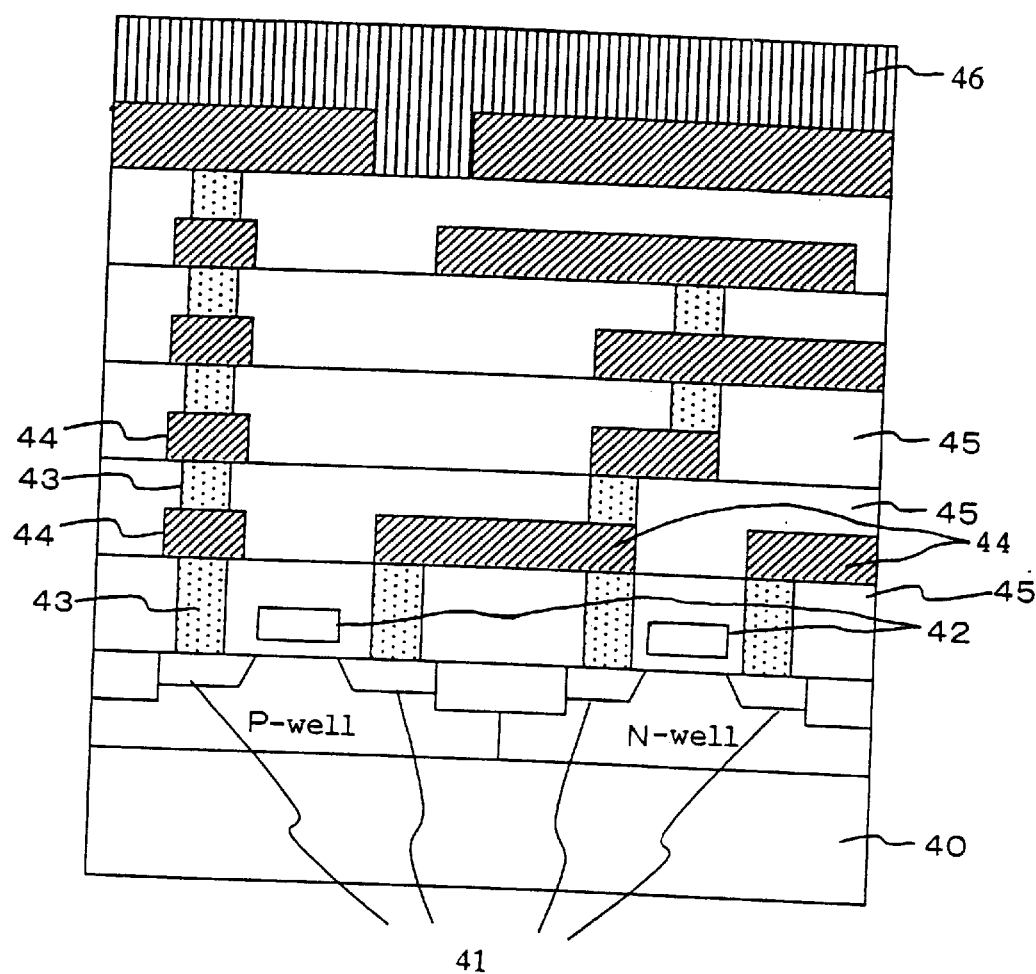
FIG. 6 is a schematic sectional view showing multilayered wiring.

The method of manufacturing a semiconductor device according to the present invention can be appropriately applied to the formation of multilayered wiring. In each of a logic device etc., 3–5 wiring layers are often provided as shown in FIG. 6. The multilayered wiring has such a structure that transistors, each of which includes a gate electrode 42 and impurity diffused layers 41, are formed in a first layer (element forming layer) on a silicon wafer 40, and that copper wiring lines 44 formed in interlayer insulating films 45 are stacked in multilayered state over the transistors. Herein, the copper wiring lines 44 are interconnected by interlayer connection plugs 43. The present invention has more remarkable effects in case of the application to such a multilayered wiring structure having three or more layers. In the multilayered wiring of three or more layers, stacked layers each consisting of a copper film and a barrier metal film are also existent three or more in the vicinity of the peripheral edge of a wafer, and film peeling is particularly prone to occur, so that copper in the vicinity of the peripheral edge of the wafer needs must be removed. Since the present invention solves problems peculiar to such copper removal processing, it is especially effective when applied to the multilayered wiring.

The preferred embodiments of the present invention will be described.

First Embodiment

There will be described an embodiment in which the present invention is applied to a copper wiring forming process based on a damascene process.

Figure 7A:
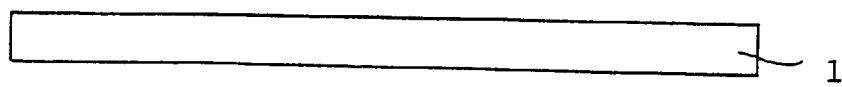
FIGS. 7A through 7F are enlarged sectional views of a wiring pattern at the outer peripheral part of the wafer for explaining the method of manufacturing a semiconductor device according to the present invention.
Figure 7B:
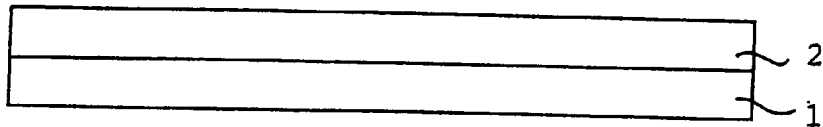
Figure 7C:
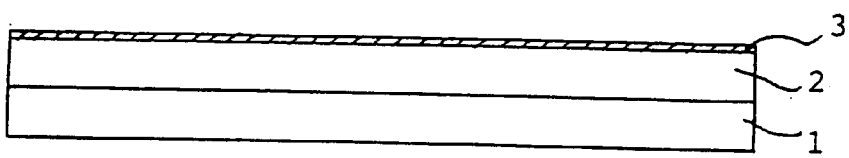
Figure 7D:
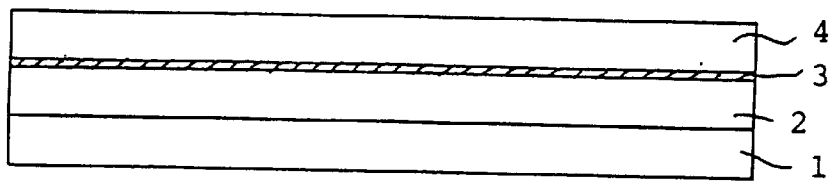
Figure 7E:
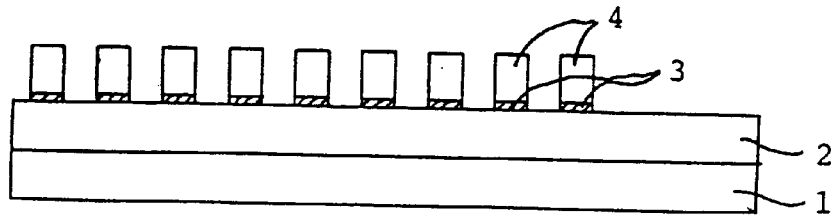
Figure 7F:
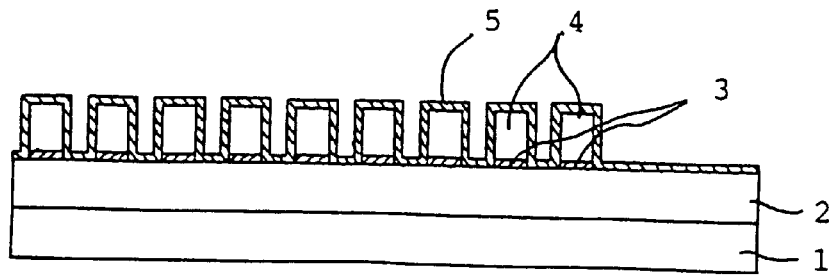
Figure 7G:
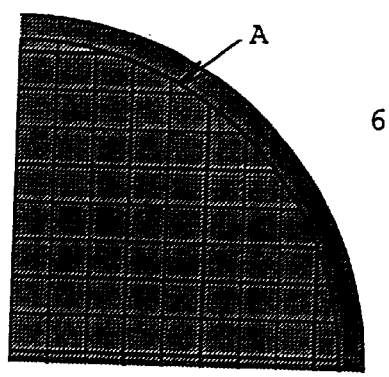
FIG. 7G is an enlarged plan view of a wafer for explaining a method of manufacturing a semiconductor device according to the present invention.
Figure 7H:
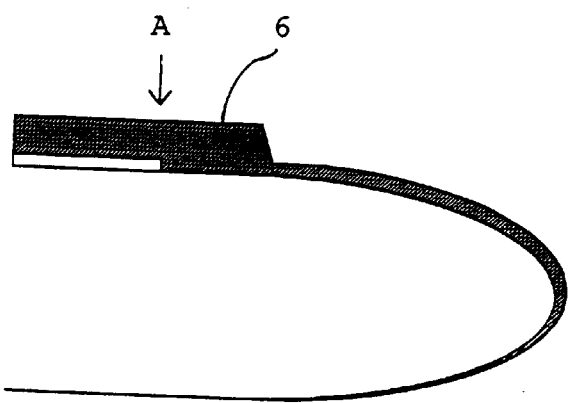
FIG. 7H is an enlarged sectional view of the bevel part of the wafer for explaining the method of manufacturing a semiconductor device according to the present invention.
Figure 7I:
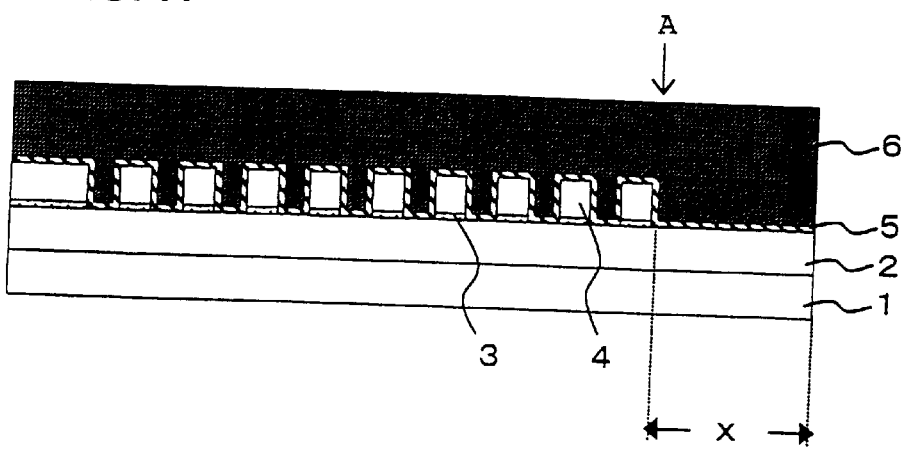
FIG. 7I is an enlarged sectional view of a wiring pattern at the outer peripheral part of the wafer for explaining the method of manufacturing a semiconductor device according to the present invention.

Initially, a copper film 6 is formed so as to fill a wiring groove pattern formed on a silicon oxide film 4 (refer to FIGS. 7G–7I).

More specifically, first of all, a silicon oxide film 2, a silicon oxynitride film 3 and the silicon oxide film 4 are formed on a silicon wafer 1 in the mentioned order as shown in FIGS. 7A–7D. Secondly, wiring grooves in the predetermined pattern are formed by known lithographic and etching techniques as shown in FIG. 7E. Herein, the plurality of wiring grooves for forming wiring lines are provided, having various widths in accordance with the roles of wiring lines. Usually, the widths and intervals of wiring lines are set within a range of 0.2–1 μm. On the other hand, the part of the silicon oxide film 4 on the peripheral part of the silicon wafer 1 is removed by performing peripheral exposure with the remaining part of the wafer being masked. The peripheral exposure region on which the silicon oxide film 4 is removed, is region whose distance from the peripheral edge of the wafer 1 is a predetermined value (denoted by x) or less. That is, the silicon oxide film 4 is removed on the annular region of the width x extending along the peripheral edge of the wafer 1. The value x is set at, for example, about 1–10 mm in a case where the silicon wafer 1 employed has a diameter of 200 mm.

Subsequently, a barrier metal film 5 is formed on the whole surface of the wafer by sputtering as shown in FIG. 7F. The material of the barrier metal film 5 is appropriately selected from among Ta, TaN, TiN, Ti, W, WN, etc., and a multilayered film including films of these materials can also be employed. Among the above materials, Ta or TaN is favorably used in point of a high capability of preventing copper from diffusing thereinto. The thickness of the barrier metal film 5 is set at, for example, 5–50 nm.

Subsequently, the copper film 6 is formed. Any of plating, CVD, sputtering, etc. is usable as a method of forming the copper film 6, and the plating or CVD affording a good coverage is favorably employed. In plating, the copper film 6 is formed in such a way that, after a seed copper film is first formed by sputtering, the wafer is immersed in a plating bath. In the CVD, the copper film 6 is formed by one step or two steps of CVD film formation. The thickness of the copper film 6 is set at, for example, 500–800 nm at the flat part of the wafer. The state of the wafer at the stage at which the copper film 6 has been formed in the above way, is shown in FIGS. 7G–7I.

Figure 8A:
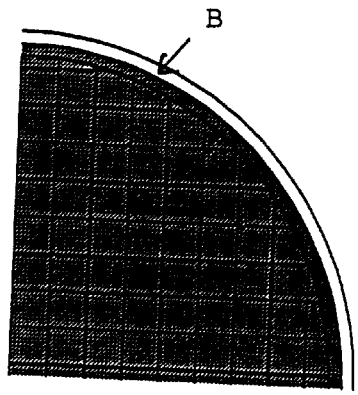
FIG. 8A is an enlarged plan view of the wafer for explaining the method of manufacturing a semiconductor device according to the present invention.
Figure 8B:
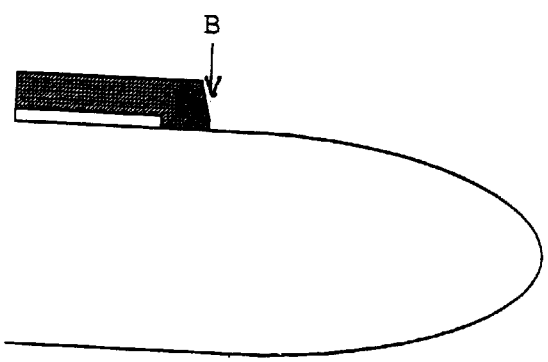
FIG. 8B is an enlarged sectional view of the bevel part of the wafer for explaining the method of manufacturing a semiconductor device according to the present invention.
Figure 8C:
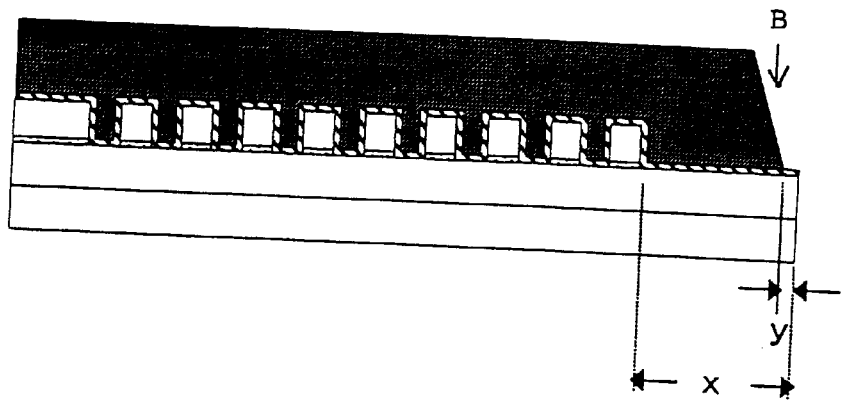
FIG. 8C is an enlarged sectional view of the wiring pattern at the outer peripheral part of the wafer for explaining the method of manufacturing a semiconductor device according to the present invention.

At the next step, copper adhering to the back surface and peripheral part of the silicon wafer 1 is removed by wet processing (refer to FIGS. 8A–8C). The method of the removal is, for example, wet etching. A usable etchant is a solution which contains HF (hydrofluoric acid), nitric acid, or the like, and preferably a water solution which contains hydrofluoric acid and hydrogen peroxide, nitric acid and hydrogen peroxide, or the likes.

Figure 9:
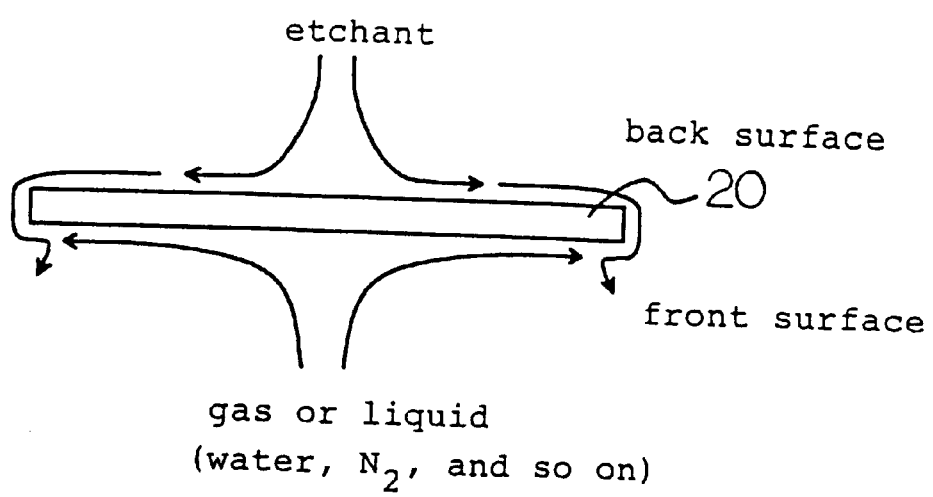
FIG. 9 is a schematic sectional view for explaining removing process of copper at the peripheral edge of the wafer in the manufacturing method.

By way of example, the wet etching is implemented as illustrated in FIG. 9. In the illustrated embodiment, the etchant is held in touch with the back surface of a silicon wafer 20 and the peripheral part of the front surface of the wafer while the wafer is being rotated and also while a gas or liquid is being blown against the front surface of the substrate. The etchant to turn toward the peripheral end part of the wafer is controlled by blowing the gas or liquid, whereby the element forming surface of the wafer is protected. An inert gas such as nitrogen can be used as the gas which is blown. Pure water or the like can be used as the liquid which is blown.

Figure 2A:
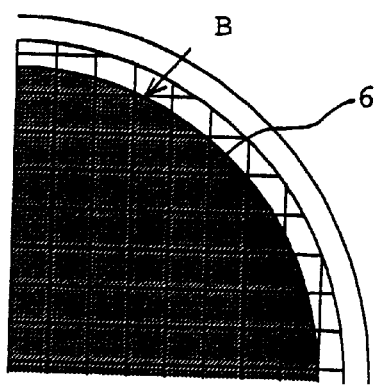
FIG. 2A is an enlarged plan view of the wafer for explaining the prior-art method of manufacturing a semiconductor device.
Figure 2B:
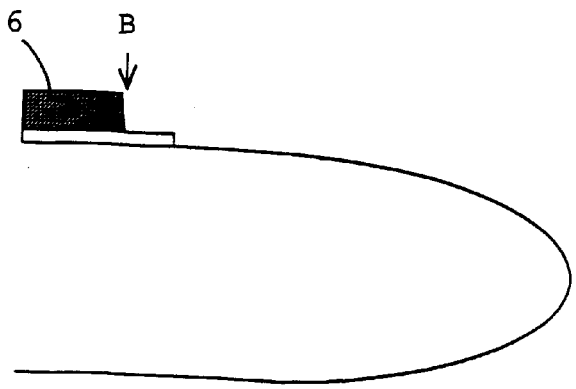
FIG. 2B is an enlarged sectional view of the bevel part of the wafer for explaining the prior-art method of manufacturing a semiconductor device.
Figure 2C:
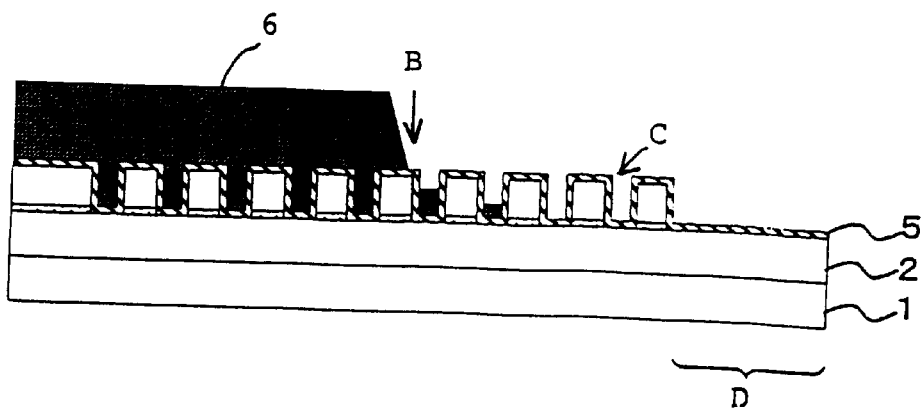
FIG. 2C is an enlarged sectional view of the wiring pattern at the outer peripheral part of the wafer for explaining the prior-art method of manufacturing a semiconductor device.

Since the next step is CMP, the copper removal processing need not entirely remove the copper on the peripheral exposure region, but it may chiefly removes the copper on the back surface of the wafer. In this respect, the purpose of the copper removal processing is different from that of the removal processing in FIGS. 2A–2C (prior art) followed by the film formation processing. The removal of the copper film 6 by etching as shown in FIGS. 8A–8C proceeds on a region which extends from a position within the peripheral exposure region, that is, a position where the patterned silicon oxide film 4 is not existent, to the peripheral edge of the silicon wafer 1. In other words, the region on which the copper film 6 is removed is the region whose distance from the peripheral edge of the wafer 1 is a predetermined value y (y<x) or less, and the annular region of the width y extending along the peripheral edge of the wafer 1 is the removal region of the copper film 6. The value y is set at, for example, about 1–3 mm in the case where the silicon wafer 1 employed has the diameter of 200 mm.

Figure 10A:
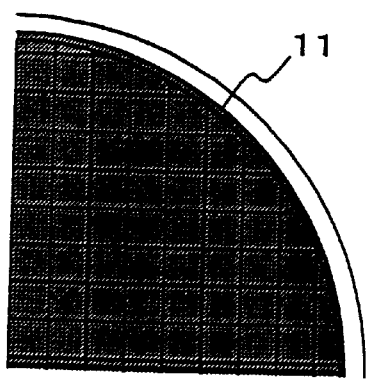
FIG. 10A is an enlarged plan view of the wafer for explaining the method of manufacturing a semiconductor device according to the present invention.
Figure 10B:
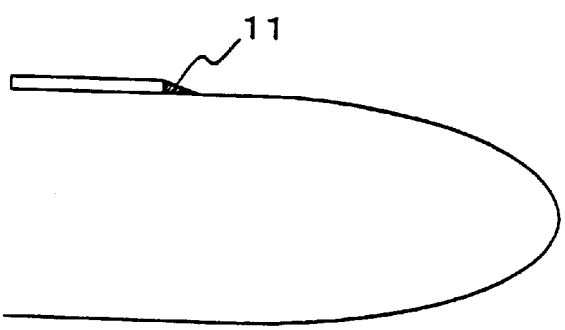
FIG. 10B is an enlarged sectional view of the bevel part of the wafer for explaining the method of manufacturing a semiconductor device according to the present invention.
Figure 10C:
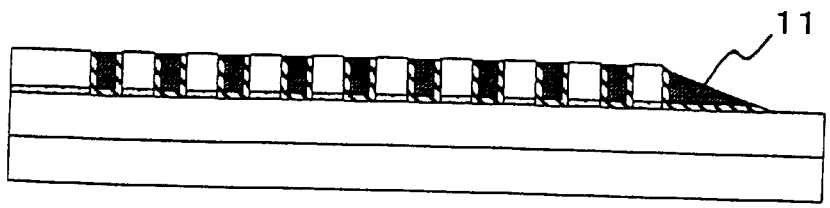
FIG. 10C is an enlarged sectional view of the wiring pattern at the outer peripheral part of the wafer for explaining the method of manufacturing a semiconductor device according to the present invention.

Subsequently, parts of the copper film 6 and barrier metal film 5 formed on any region other than the wiring grooves are polished away by the CMP, thereby to form the damascened copper wiring consisting of the copper film 6 embedded in the wiring grooves (refer to FIGS. 10A–10C). On this occasion, a copper residue 11 appears around the region formed with the silicon oxide film 4 like a sidewall, as shown in the figures.

When a film forming step is performed without removing the copper residue 11, this copper residue 11 peels off and causes cross-contamination.

Figure 11A:
FIG. 11A is an SEM (Scanning Electron Microscope) photograph showing a cohesive state of copper.
Figure 11B:
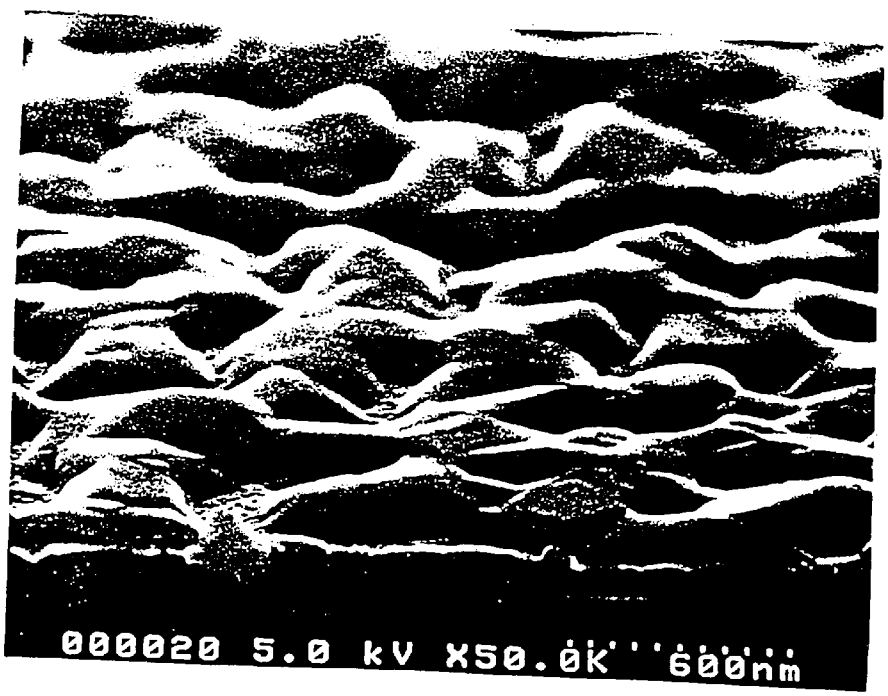
FIG. 11B is another SEM photograph showing a cohesive state of copper.
Figure 12:
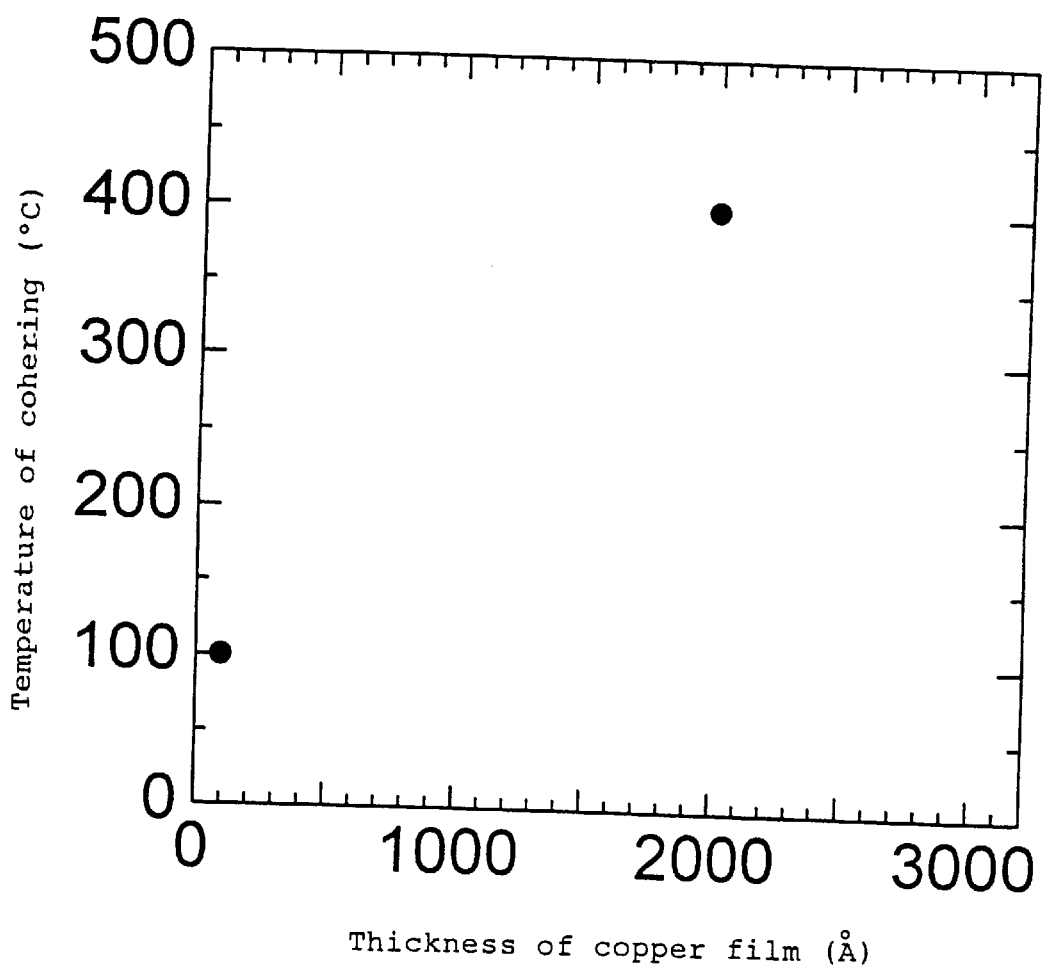
FIG. 12 is a graph showing dependency of the temperature on the film-thickness at which the copper coheres.

A further problem is that, since the copper residue 11 is a thin film, copper coheres and an interlayer insulating film to be formed on the cohering copper becomes prone to peel off. FIGS. 11A and 11B are SEM photographs showing states where such copper coheres. These figures are the SEM photographs of different regions vicinal to the peripheral edge of the wafer, and insular parts indicate the copper cohering. Such cohesion is more liable to arise with a higher temperature and a thinner copper film. FIG. 12 is a graph showing the relationship between the thickness of a copper film and the temperature at which the copper coheres. The thickness of the copper film is usually 500 nm and below. It is accordingly understood that the copper will cohere at a high possibility.

Therefore, the copper in the vicinity of the peripheral edge of the wafer 1 is removed for the purpose of removing the copper residue 11. The method of the removal is, for example, wet etching. A usable etchant is a solution which contains HF (hydrofluoric acid), nitric acid, or the like, and preferably a water solution which contains hydrofluoric acid and hydrogen peroxide, nitric acid and hydrogen peroxide, or the likes. A region for the removal is the region whose distance from the peripheral edge of the wafer 1 is a predetermined value z (x<z) or less. In other words, the copper film 6 is removed on the annular region of the width z larger than the width x of the peripheral exposure region along the peripheral edge of the wafer 1. The value z is set at, for example, about 5–20 mm in the case where the silicon wafer 1 employed has the diameter of 200 mm.

Figure 13A:
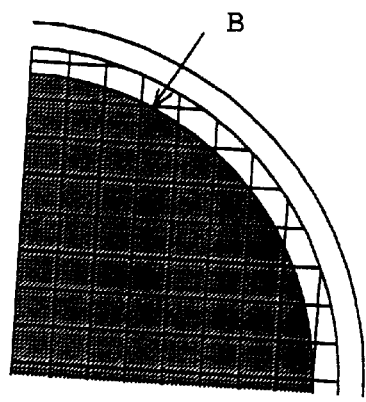
FIG. 13A is an enlarged plan view of the wafer for explaining the method of manufacturing a semiconductor device according to the present invention.
Figure 13B:
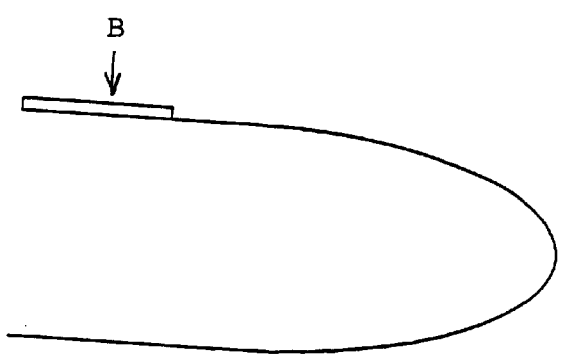
FIG. 13B is an enlarged sectional view of the bevel part of the wafer for explaining the method of manufacturing a semiconductor device according to the present invention.
Figure 13C:
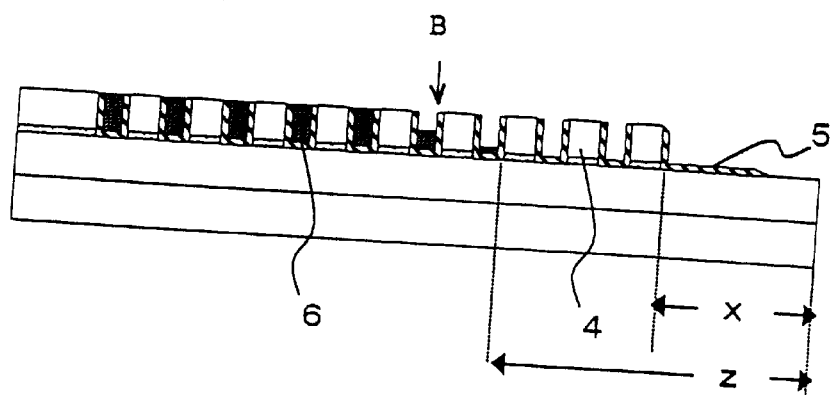
FIG. 13C is an enlarged sectional view of the wiring pattern at the outer peripheral part of the wafer for explaining the method of manufacturing a semiconductor device according to the present invention.

The wafer after removal of the copper film 6 in the above way is shown in FIGS. 13A–13C. The vicinity of the peripheral edge of the wafer 1 has such a structure that the average thickness of the conductive film embedded in each of the recesses lessens nearer to the peripheral edge of the wafer, and that the silicon oxide film 4 is exposed at the bottom of each of the grooves still nearer to the peripheral edge of the wafer. In other words, the conductive film is not formed at all or the conductive film whose thickness is less than the depth of the recess is formed. As shown in FIG. 13C, the thinner copper films 6 are formed within some of the grooves. Since, however, the copper films 6 within the grooves lie in close adhesion with the inner surfaces of the corresponding grooves, the problem of the copper cohesion as explained before is hardly posed.

Figure 4A:
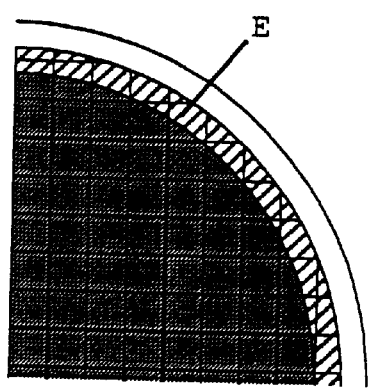
FIG. 4A is an enlarged plan view of the wafer for explaining the prior-art method of manufacturing a semiconductor device.
Figure 4B:
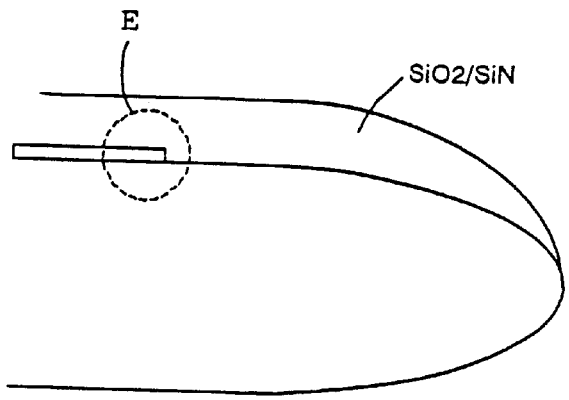
FIG. 4B is an enlarged sectional view of the bevel part of the wafer for explaining the prior-art method of manufacturing a semiconductor device.
Figure 4C:
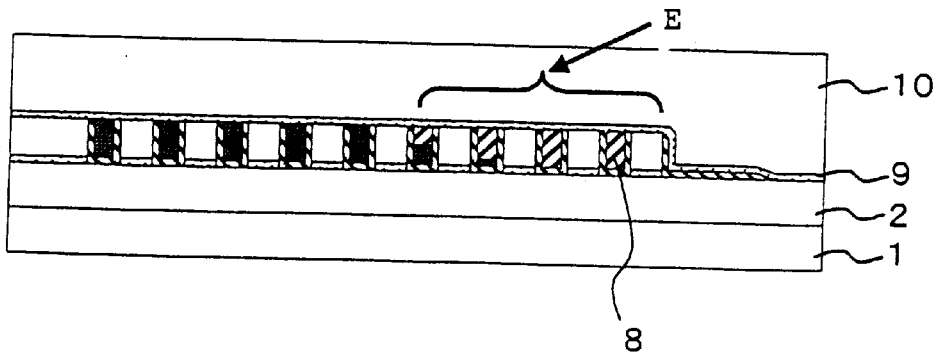
FIG. 4C is an enlarged sectional view of the wiring pattern at the outer peripheral part of the wafer for explaining the prior-art method of manufacturing a semiconductor device.
Figure 14A:
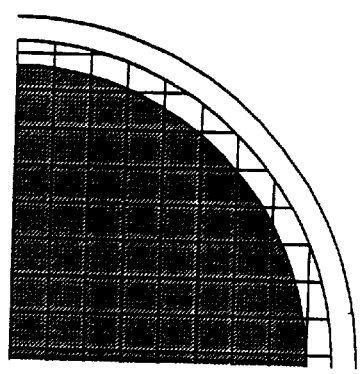
FIG. 14A is an enlarged plan view of the wafer for explaining the method of manufacturing a semiconductor device according to the present invention.
Figure 14B:
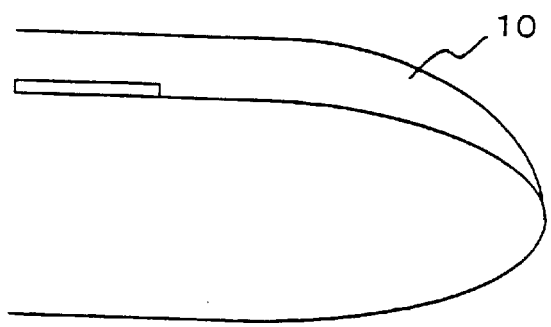
FIG. 14B is an enlarged sectional view of the bevel part of the wafer for explaining the method of manufacturing a semiconductor device according to the present invention.
Figure 14C:
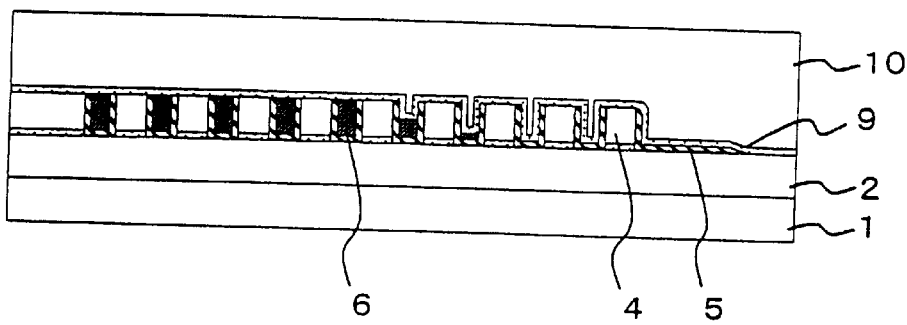
FIG. 14C is an enlarged sectional view of the wiring pattern at the outer peripheral part of the wafer for explaining the method of manufacturing a semiconductor device according to the present invention.

After the removal processing of the part of the copper film 6 at the peripheral end part of the wafer 1, a protective film 9 made of SiN and the interlayer insulating film 10 made of $SiO_2$ or the like are formed on the surface of the wafer in the mentioned order. The material of the interlayer insulating film 10 is not restricted to the $SiO_2$, and a low permittivity film such as organic SOG film or inorganic SOG film can be employed as the film 10. The wafer after the film formation is shown in FIGS. 14A–14C. In each of the wiring grooves in the vicinity of the peripheral edge of the wafer 1, the interlayer insulating film 10 is stacked on the silicon oxide film 4 through the protective SiN film 9. More specifically, in the structure of FIGS. 14A–14C, the polishing debris 8 are not packed in each of the grooves as in the prior art illustrated in FIGS. 4A–4C, and the protective film 9 is formed in touch with the silicon oxide film 4 or the copper film 6 and is overlaid with the interlayer insulating film 10. Therefore, the problem of the peeling of the interlayer insulating film 10 is not posed.

A semiconductor device which includes the damascened copper wiring, is finished up in the above way. Thereafter, multilayered wiring can also be formed by stacking a wiring layer in accordance with a process similar to the foregoing.

According to the method of this embodiment, the product yield can be improved, and the semiconductor device of high reliability free from the problems of the peeling of the film, etc. can be fabricated.

Although this embodiment has been described on the embodiment of the formation of the wiring structure employing the so-called single damascene process, the present invention is, of course, applicable also to a process for forming plugs or pads based on the damascene process, and to a process for forming a multilayered wiring structure based on a dual damascene process.

Second Embodiment

This embodiment will be described on an embodiment in which damascened copper wiring is formed using HSQ as the material of an insulating layer for a wiring layer.

Figure 15A:
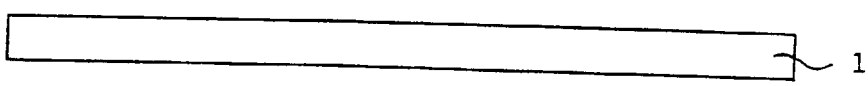
FIGS. 15A through 15G are enlarged sectional views of the wiring pattern at the outer peripheral part of a wafer for explaining another method of manufacturing a semiconductor device according to the present invention.
Figure 15B:
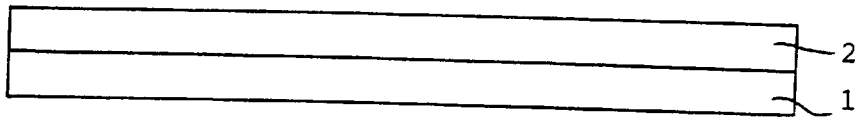
Figure 15C:
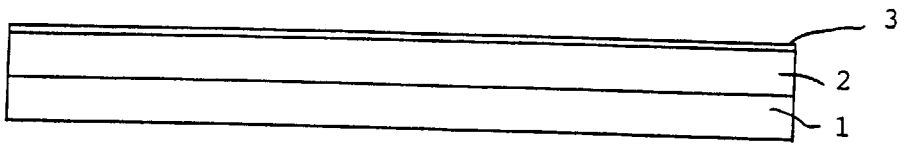
Figure 15D:
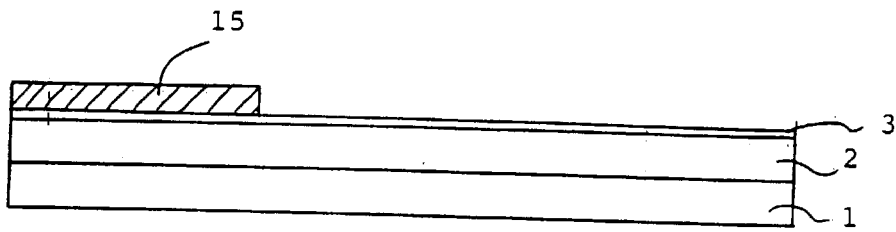
Figure 15E:
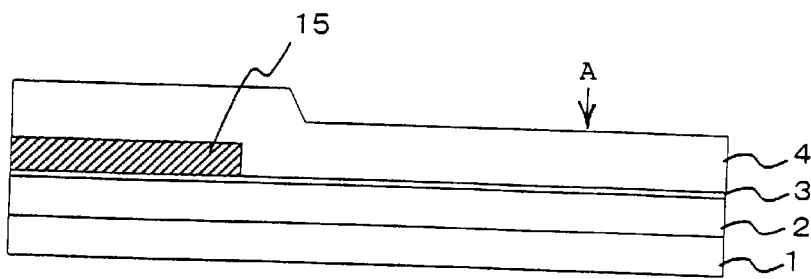

First, as shown in FIGS. 15A–15C, a silicon oxide film 2 and a silicon oxynitride film 3 are formed on a silicon wafer 1 in the mentioned order. Thereafter, an HSQ film 15 is formed on the wafer inside a predetermined distance from the peripheral edge of the wafer 1 as shown in FIG. 15D, and a silicon oxide film 4 is formed on the whole surface of the wafer as shown in FIG. 15E. The HSQ film 15 in the above shape can be formed in such a way that an HSQ film is formed on the whole surface of the silicon oxynitride film 3, and that the peripheral part of the HSQ film is thereafter etched and removed on a region whose distance from the peripheral of the silicon wafer 1 is a predetermined value d or less. The thicknesses of the films can be appropriately set and the thickness of the HSQ film 15 is set at, for example, about 200–500 nm and that of the silicon oxide film 4 is set at, for example, about 700–1000 nm. The HSQ film 15 can be formed from a silicon oxide film 4 by spin coating or the like.

Figure 15F:
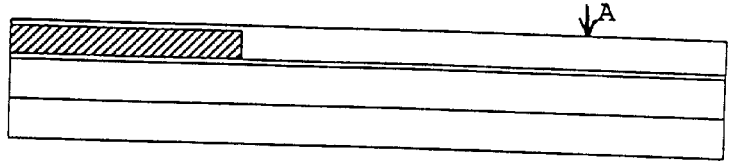

Subsequently, CMP is carried out to flatten the whole surface of the wafer as shown in FIG. 15F.

Figure 15G:
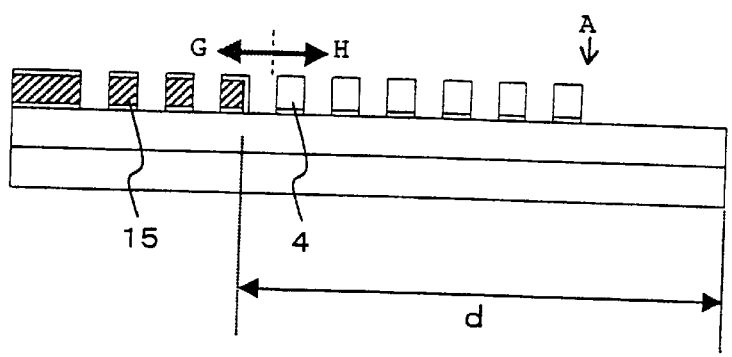
Figure 16A:
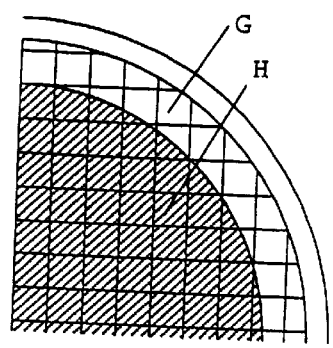
FIG. 16A is an enlarged plan view of the wafer for explaining another method of manufacturing a semiconductor device according to the present invention.
Figure 16B:
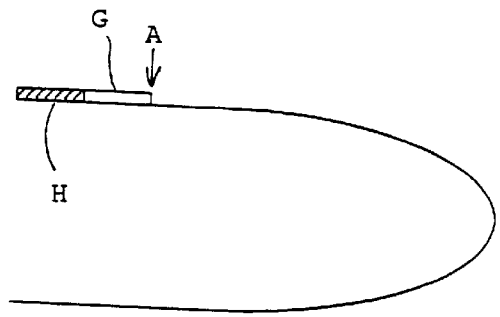
FIG. 16B is an enlarged sectional view of the bevel part of the wafer for explaining another method of manufacturing a semiconductor device according to the present invention.

At the next step, wiring grooves in a predetermined pattern are formed by known lithographic and etching techniques. Herein, the plurality of wiring grooves are provided having widths which can be set at various values in accordance with the roles of wiring lines. Usually, the widths and intervals of wiring lines are set within a range of 0.2–1 μm. On the other hand, the part of the silicon oxide film 4 on the peripheral part of the silicon wafer 1 is removed by performing peripheral exposure. The wafer at this stage is shown in FIG. 15G and FIGS. 16A and 16B. G is a region of low permittivity film and H is a region of $SiO_2$ film.

Thereafter, a barrier metal film and a copper film are embedded in the wiring grooves so as to form the damascened copper wiring. Regarding a wiring forming process, the prior-art method shown in FIG. 1A–FIG. 4C can be employed, but the method shown in FIGS. 7G–8C, FIGS. 10A–10C, and FIGS. 13A–14C (the first embodiment) which prevents polishing debris is favorably adopted. In this embodiment, the wiring process employing steps similar to the first embodiment will be described below.

First, the barrier metal film 5 made of tantalum at a thickness of about 10–50 nm is formed on the whole surface of the wafer by sputtering. Subsequently, the copper film 6 is formed by plating. The thickness of the copper film 6 is set at, for example, 500–800 nm at the flat part of the wafer (refer to FIGS. 17A–17C).

Subsequently, copper adhering to the back surface and peripheral part of the wafer 1 is removed by wet processing (refer to FIGS. 18A–18C). A region on which the copper film 6 is removed is the region whose distance from the peripheral edge of the wafer 1 is a predetermined value y or less (y<x, where x denotes the width of the removal region of the silicon oxide film 4). That is, the copper film 6 is removed on the annular region of the width y (y<x) extending along the peripheral edge of the wafer 1.

Subsequently, the superfluous parts of the copper film 6 and barrier metal film 5 are removed by CMP, thereby to form the damascened copper wiring consisting of the copper film 6 embedded in the wiring grooves (refer to FIGS. 19A–19C). In order to remove a copper residue 11 having appeared on this occasion, removal of the copper film is carried out. A region for removing the copper film is the region whose distance from the peripheral edge of the wafer 1 is a predetermined value z (x<z<d) or less (refer to FIGS. 20A–20C). That is, the copper film is removed on the annular region of the width z larger than the width x of the peripheral exposure region along the peripheral edge of the wafer 1. The removal of the copper film is implemented by wet etching which employs an etchant containing HF or the like.

The wafer after removal of the conductive film is shown in FIGS. 20A–20C. On this occasion, the wiring grooves are exposed in the vicinity of the peripheral edge of the wafer. On the peripheral region, however, the HSQ film 15 is not formed, but the silicon oxide film 4 is formed. Since silicon oxide is superior to HSQ in resistance against chemicals, the wiring-line insulating film is not damaged as in FIGS. 5A–5C. The region where the silicon oxide film 4 is formed is outside an element forming region and it is not utilized as a semiconductor chip. In the region, an insulating film needs not especially to have a low permittivity.

Figure 21A:
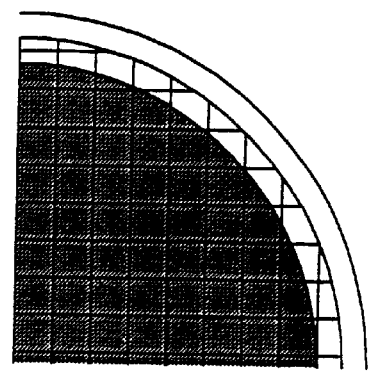
FIG. 21A is an enlarged plan view of the wafer for explaining another method of manufacturing a semiconductor device according to the present invention.
Figure 21B:
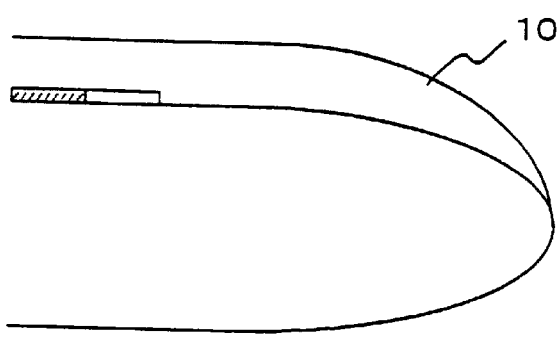
FIG. 21B is an enlarged sectional view of the bevel part of the wafer for explaining another method of manufacturing a semiconductor device according to the present invention.
Figure 21C:
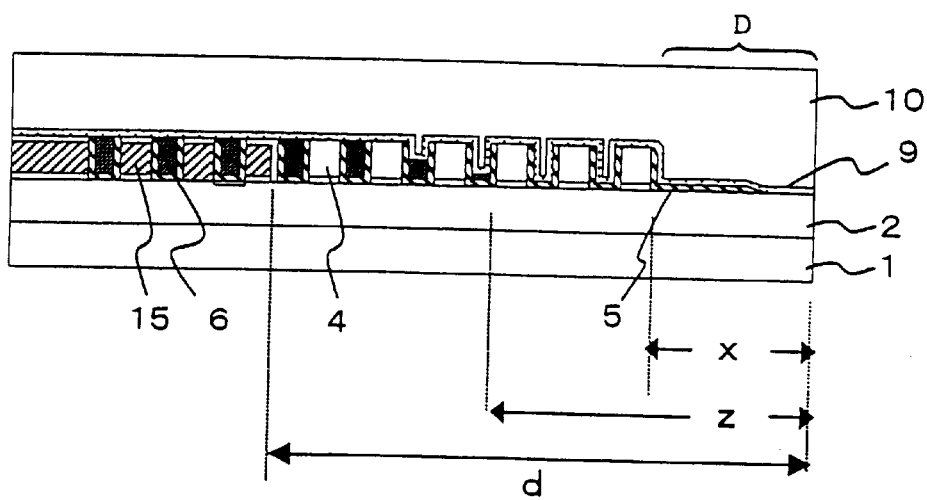
FIG. 21C is an enlarged sectional view of the wiring pattern at the outer peripheral part of the wafer for explaining another method of manufacturing a semiconductor device according to the present invention.

Thereafter, a protective film 9 of SiN and the interlayer insulating film 10 of $SiO_2$ or the like are formed on the surface of the wafer in the mentioned order. The material of the interlayer insulating film 10 is not restricted to the $SiO_2$, and a low permittivity film such as organic SOG film or inorganic SOG film can be employed as the film 10. A semiconductor device which includes the damascened copper wiring, is finished up in the above way (refer to FIGS. 21A–21C).

Thereafter, multilayered wiring can also be formed by overlaying the structure with a wiring layer in accordance with a process similar to the foregoing processes.

According to this embodiment, in forming the copper film 6 in the wiring grooves, the copper is polished by the CMP, and the remaining copper in the vicinity of the peripheral edge of the wafer 1 is removed by the wet etching. The removal region of the copper is set larger than the peripheral exposure region. The insulating film for the wiring layer consists of the silicon oxide film 4 in the vicinity of the peripheral edge of the wafer 1, and the HSQ film 15 in the other region. Since such a construction is adopted, the wiring-layer insulating film can be effectively prevented from suffering damage at the step of the wet etching of the copper at the peripheral part. Moreover, the wiring grooves can be prevented from being filled with the polishing debris. It is therefore possible to improve the product yield, and to fabricate the semiconductor device of high reliability free from the problems of the peeling of the film, etc.

Although this embodiment has been described on the example of the formation of the wiring structure employing the so-called single damascene process, the present invention is, of course, applicable also to a process for forming plugs or pads based on the damascene process, and to a process for forming a multilayered wiring structure based on a dual damascene process.

Third Embodiment

This embodiment will be described on an embodiment in which damascened copper wiring is formed using HSQ as the material of an insulating layer for a wiring layer.

Figure 22A:
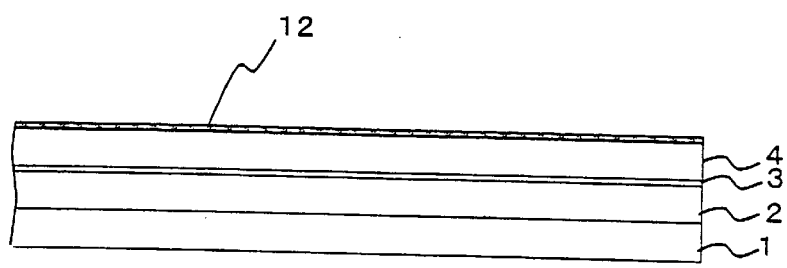
FIGS. 22A through 22C are sectional views of a wafer for explaining still another method of manufacturing a semiconductor device according to the present invention.
Figure 22B:
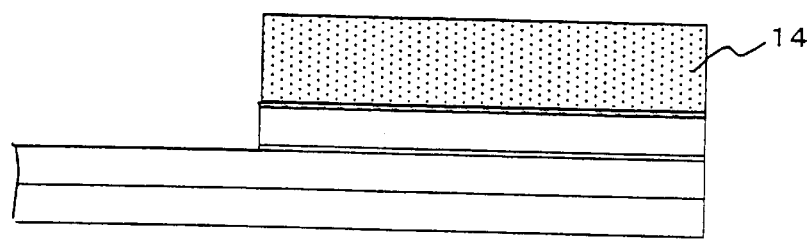

First, a silicon oxide film 2, a silicon oxynitride film 3, and a silicon oxide film 4 are formed on a silicon wafer 1 in the mentioned order by the same steps as shown in FIGS. 7A–7D. Next, a hydrophobic film 12 of SiN is formed as shown in FIG. 22A. A resist 14 is formed in correspondence with that region vicinal to the peripheral edge of the wafer 1 in which semiconductor chip is not to be formed. Subsequently, using the resist 14 as a mask, the hydrophobic film 12 of SiN, the silicon oxide film 4 and the silicon oxynitride film 3 are subjected to dry etching so as to expose the surface of the silicon oxide film 2 (refer to FIG. 22B).

Figure 22C:
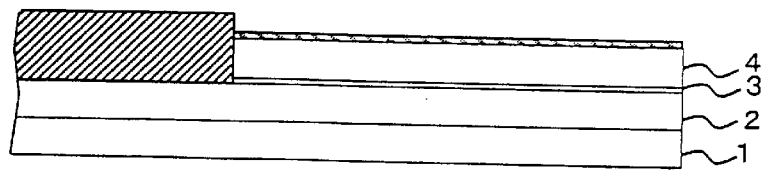

After the resist 14 has been removed, the whole surface of the wafer is coated with the solution of the material of an HSQ film by spin coating. On this occasion, the surface of the hydrophobic film 12 of SIN is hydrophobic, whereas the surface of the silicon oxide film 2 is hydrophilic. Therefore, the solution of the material of the HSQ film is selectively applied onto the surface of the silicon oxide film 2. This state is shown in FIG. 22C. Oxygen plasma processing may well be carried out in order to heighten the hydrophilicity of the surface of the silicon oxide film 2. By way of example, the oxygen plasma processing can be implemented under the conditions of an oxygen flow rate of 30 sccm, a pressure of 1 mTorr and a bias of 500 W.

Figure 23A:
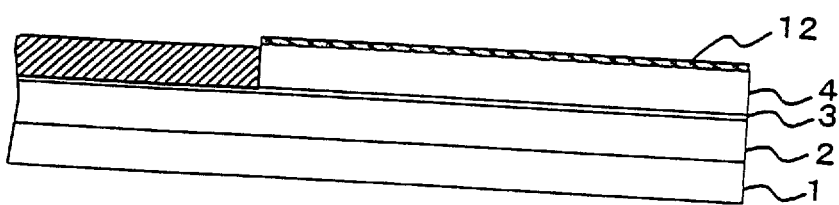
FIGS. 23A and 23B are sectional views of the wafer for explaining still another method of manufacturing a semiconductor device according to the present invention.
Figure 23B:
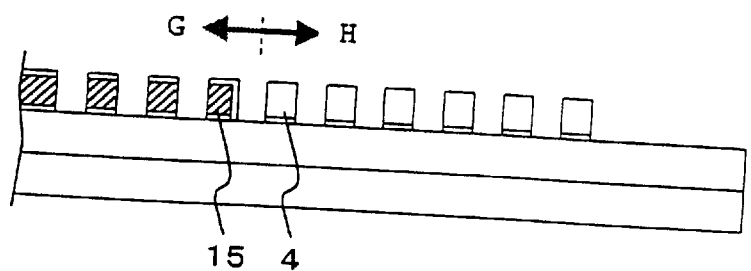

After the coating operation, a heat treatment is carried out (refer to FIG. 23A). Subsequently, wiring grooves in a predetermined pattern are formed by known lithographic and etching techniques (refer to FIG. 23B). The part of silicon oxide film 4 on the peripheral part of the wafer is removed by peripheral exposure.

Figure 17A:
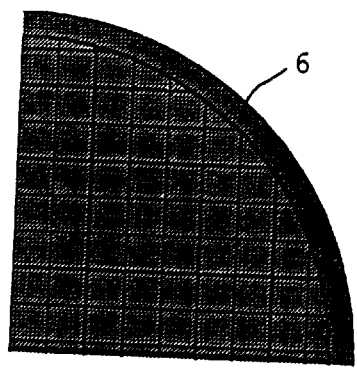
FIG. 17A is an enlarged plan view of the wafer for explaining another method of manufacturing a semiconductor device according to the present invention.
Figure 17B:
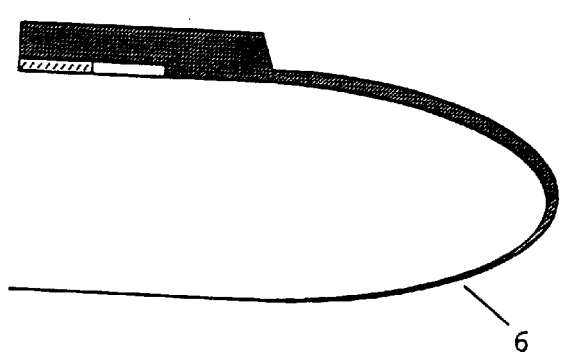
FIG. 17B is an enlarged sectional view of the bevel part of the wafer for explaining another method of manufacturing a semiconductor device according to the present invention.
Figure 17C:
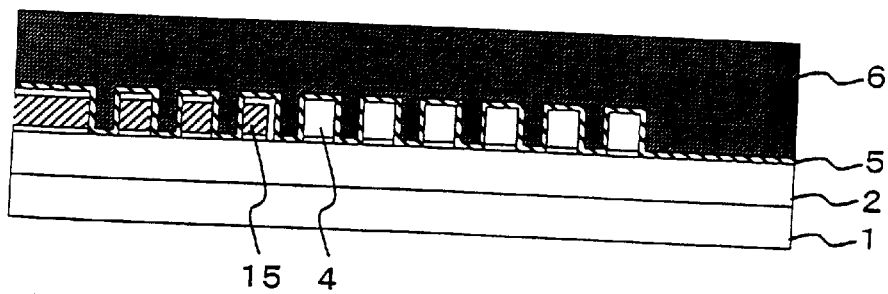
FIG. 17C is an enlarged sectional view of the wiring pattern at the outer peripheral part of the wafer for explaining another method of manufacturing a semiconductor device according to the present invention.

Subsequently, a barrier metal film 5 and a copper film 6 are formed on the whole surface of the wafer as shown in FIGS. 17A–17C. Thereafter, the copper wiring is formed via steps similar to those of the second embodiment as shown in FIG. 18A–FIG. 21C.

According to the method of this embodiment, the insulating film for the wiring layer at the peripheral end part of the wafer is made of silicon oxide, so that the wiring-layer insulating film can be effectively prevented from suffering damage at the step of the wet etching of the copper at the peripheral part. Moreover, the wiring grooves can be prevented from being filled with the polishing debris. It is therefore possible to improve the product yield, and to fabricate a semiconductor device of high reliability free from the problems of the peeling of the film, etc.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:

at least one insulating layer formed on a principal surface of a wafer;

a plurality of recesses provided in said insulating layer;

an insulating film embedded in said recesses in the vicinity of a peripheral edge of said wafer, which is formed in touch with said insulating layer; and a conductive film embedded in said recesses on the region other than said vicinity of the peripheral edge of said wafer.

2. A semiconductor device according to claim 1, wherein said insulating layer consists of a silicon oxide film provided on a region in said vicinity of said peripheral edge of said wafer and a low permittivity film having a permittivity lower than that of silicon oxide, which is provided on the region other than said vicinity of said peripheral edge of said wafer.

3. A semiconductor device according to claim 1, wherein said low permittivity film is an organic SOG film, an inorganic SOG film, or a fluorine containing film.

* * * * *